United States Patent
Lee

(10) Patent No.: US 8,373,480 B2
(45) Date of Patent: Feb. 12, 2013

(54) DELAY LOCKED LOOP SEMICONDUCTOR APPARATUS THAT MODELS A DELAY OF AN INTERNAL CLOCK PATH

(75) Inventor: Dong Uk Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/526,761

(22) Filed: Jun. 19, 2012

(65) Prior Publication Data

US 2012/0256667 A1    Oct. 11, 2012

Related U.S. Application Data

(62) Division of application No. 12/833,123, filed on Jul. 9, 2010, now Pat. No. 8,222,938.

(30) Foreign Application Priority Data

Feb. 24, 2010    (KR) .......................... 10-2010-0016574

(51) Int. Cl.
*H03L 7/06* (2006.01)
(52) U.S. Cl. .......... 327/158; 327/147; 327/156; 327/149
(58) Field of Classification Search .................. 327/147, 327/149, 156, 158
See application file for complete search history.

(56) References Cited

U.S. PATENT DOCUMENTS

| | | | |
|---|---|---|---|
| 6,573,771 B2 | 6/2003 | Lee et al. | |
| 6,603,339 B2 | 8/2003 | Atallah et al. | |
| 6,853,225 B2 | 2/2005 | Lee | |
| 6,963,235 B2 | 11/2005 | Lee | |
| 6,968,026 B1* | 11/2005 | Li et al. | 375/371 |
| 7,227,809 B2* | 6/2007 | Kwak | 365/189.15 |
| 7,368,964 B2* | 5/2008 | Kim et al. | 327/158 |
| 7,436,230 B2* | 10/2008 | Kim | 327/158 |
| 7,701,272 B2* | 4/2010 | Ma | 327/158 |
| 8,106,693 B2* | 1/2012 | Lee | 327/158 |
| 8,115,528 B2* | 2/2012 | Ma | 327/158 |
| 2004/0124896 A1* | 7/2004 | Byun et al. | 327/158 |
| 2005/0254318 A1* | 11/2005 | Jang et al. | 365/194 |

(Continued)

FOREIGN PATENT DOCUMENTS

| | | |
|---|---|---|
| JP | 2004-064735 A | 2/2004 |
| JP | 2004-129255 A | 4/2004 |

(Continued)

OTHER PUBLICATIONS

USPTO RR mailed Jan. 19, 2012 in connection with U.S. Appl. No. 12/833,123.

(Continued)

*Primary Examiner* — Adam Houston
(74) *Attorney, Agent, or Firm* — Ladas & Parry LLP

(57) ABSTRACT

A delay locked loop semiconductor apparatus that models a delay of an internal clock path is presented. The semiconductor apparatus includes: a DLL and a detection code output block. The DLL includes a delay model unit in which a delay value of an internal clock path is modeled and is configured to output a DLL clock signal of which the phase is controlled by reflecting the delay value of the internal clock path into an applied input clock signal. The detection code output block is configured to output a phase difference detection code having a code value corresponding to a phase difference between a first phase correction clock signal generated by reflecting a model delay value of the delay model unit into the DLL clock signal and a second phase correction clock signal generated by reflecting an actual delay value of the internal clock path into the DLL clock signal.

8 Claims, 6 Drawing Sheets

U.S. PATENT DOCUMENTS

| | | | |
|---|---|---|---|
| 2006/0197565 A1 | 9/2006 | Kang | |
| 2008/0252343 A1* | 10/2008 | Yamane | 327/158 |
| 2009/0116306 A1* | 5/2009 | Song et al. | 365/189.09 |
| 2010/0134162 A1* | 6/2010 | Kondou | 327/157 |
| 2010/0301912 A1* | 12/2010 | Kim et al. | 327/158 |
| 2011/0204941 A1* | 8/2011 | Lee | 327/158 |
| 2011/0227620 A1* | 9/2011 | Lee | 327/158 |
| 2011/0234280 A1* | 9/2011 | Na | 327/158 |
| 2011/0291718 A1* | 12/2011 | Lee | 327/158 |
| 2012/0139595 A1* | 6/2012 | Kamath et al. | 327/158 |

FOREIGN PATENT DOCUMENTS

| | | |
|---|---|---|
| JP | 2004-220602 A | 8/2004 |
| JP | 2005-316722 A | 11/2005 |
| JP | 2006-060842 A | 3/2006 |
| KR | 1020010004109 A | 1/2001 |

OTHER PUBLICATIONS

USPTO NOA mailed Mar. 20, 2012 in connection with U.S. Appl. No. 12/833,123.

* cited by examiner

DELAY LOCKED LOOP SEMICONDUCTOR APPARATUS THAT MODELS A DELAY OF AN INTERNAL CLOCK PATH

CROSS-REFERENCES TO RELATED APPLICATION

The present application claims priority under 35 U.S.C. §119(a) to Korean application No. 10-2010-0016574, filed on Feb. 24, 2010, in the Korean Intellectual Property Office, which is incorporated herein by reference in its entirety as set forth in full.

BACKGROUND

1. Technical Field

The present invention relates to a semiconductor apparatus, and more particularly, to a technology which corrects a difference between a model delay value of a delay locked loop (DLL) and an actual delay value.

2. Related Art

A semiconductor apparatus operates in synchronization with a reference periodic pulse signal, such as a clock signal, in order to improve an operation speed and to effectively perform an internal operation. Therefore, most semiconductor apparatuses operate using a clock signal supplied from outside or an internal clock signal generated depending on the particular necessity and/or configuration.

Meanwhile, an input clock signal applied to a semiconductor apparatus is delayed internally in the semiconductor apparatus. Therefore, when data is outputted by using the delayed clock signal, the outputted data may not be synchronized with the input clock signal. Accordingly, the semiconductor apparatus compensates for a phase difference between the input clock signal and the internal clock signal using a delayed lock loop (DLL), a phase locked loop (PLL) and soon.

FIG. 1 is a configuration diagram of a conventional semiconductor apparatus.

Referring to FIG. 1, the conventional semiconductor apparatus may include a DLL 2 which includes an internal clock path composed of a plurality of repeaters 3 and 5, a transfer line 4, and an output driving unit 6.

The DLL 2 is configured to output a DLL clock signal DLL_CLK of which the phase is controlled by reflecting a delay value of the internal clock path into an applied input clock signal EXT_CLK. Since the internal clock path has a delay value of 'tDO', the DLL 2 advances the phase of the input clock signal EXT_CLK by a delay value of '-tDO' to generate the DLL clock signal DLL_CLK. Therefore, an output clock signal STB_CLK which is finally outputted through the internal clock path has the same phase as the input clock signal EXT_CLK.

Meanwhile, the DLL 2 may include a delay model unit (not shown) in which the delay value of the internal clock path is modeled. The delay model unit is designed in such a manner as to have substantially the same delay value as that of the internal clock path in the ideal case. In the delay model unit in which the components of the internal clock path are modeled, however, the positions of the components are different from those of actual components. Between the model delay value and the delay value of each component, a difference may occur. In particular, the difference may further increase due to changes in process and voltage. Such a difference between the delay values may cause a reduction in timing margin of an internal circuit which operates using the DLL clock signal DLL_CLK. Therefore, there is demand for a technology capable of solving such a problem.

SUMMARY

In one embodiment of the present invention, a semiconductor apparatus includes: a DLL including a delay model unit in which a delay value of an internal clock path is modeled and configured to output a DLL clock signal of which the phase is controlled by reflecting the delay value of the internal clock path into an applied input clock signal; and a detection code output block configured to output a phase difference detection code having a code value corresponding to a phase difference between a first phase correction clock signal generated by reflecting a model delay value of the delay model unit into the DLL clock signal and a second phase correction clock signal generated by reflecting an actual delay value of the internal clock path into the DLL clock signal.

In another embodiment of the present invention, a semiconductor apparatus includes: a DLL including a delay model unit, in which a delay value of an internal clock path is modeled and of which a model delay value is controlled depending on a voltage level of a bias control voltage, and configured to output a DLL clock signal of which the phase is controlled by reflecting the delay value of the internal clock path into an applied input clock signal; and a control voltage output block configured to output the bias control voltage having a voltage level corresponding to a phase difference between a first phase correction clock signal generated by reflecting the model delay value of the delay model unit into the DLL clock signal and a second phase correction clock signal generated by reflecting an actual delay value of the internal clock path into the DLL clock signal.

BRIEF DESCRIPTION OF THE DRAWINGS

Features, aspects, and embodiments are described in is conjunction with the attached drawings, in which.

DETAILED DESCRIPTION

Hereinafter, a semiconductor apparatus according to the present invention will be described below with reference to the accompanying drawings through preferred embodiments.

Figure 1:
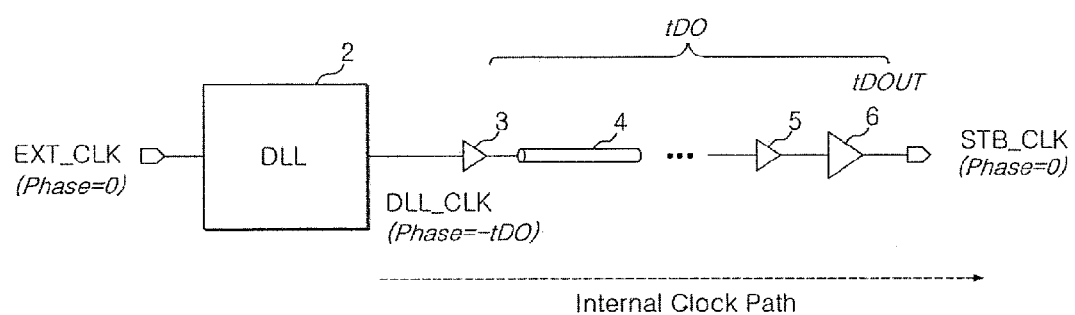
FIG. 1 is a configuration diagram of a conventional semiconductor apparatus.
Figure 2:
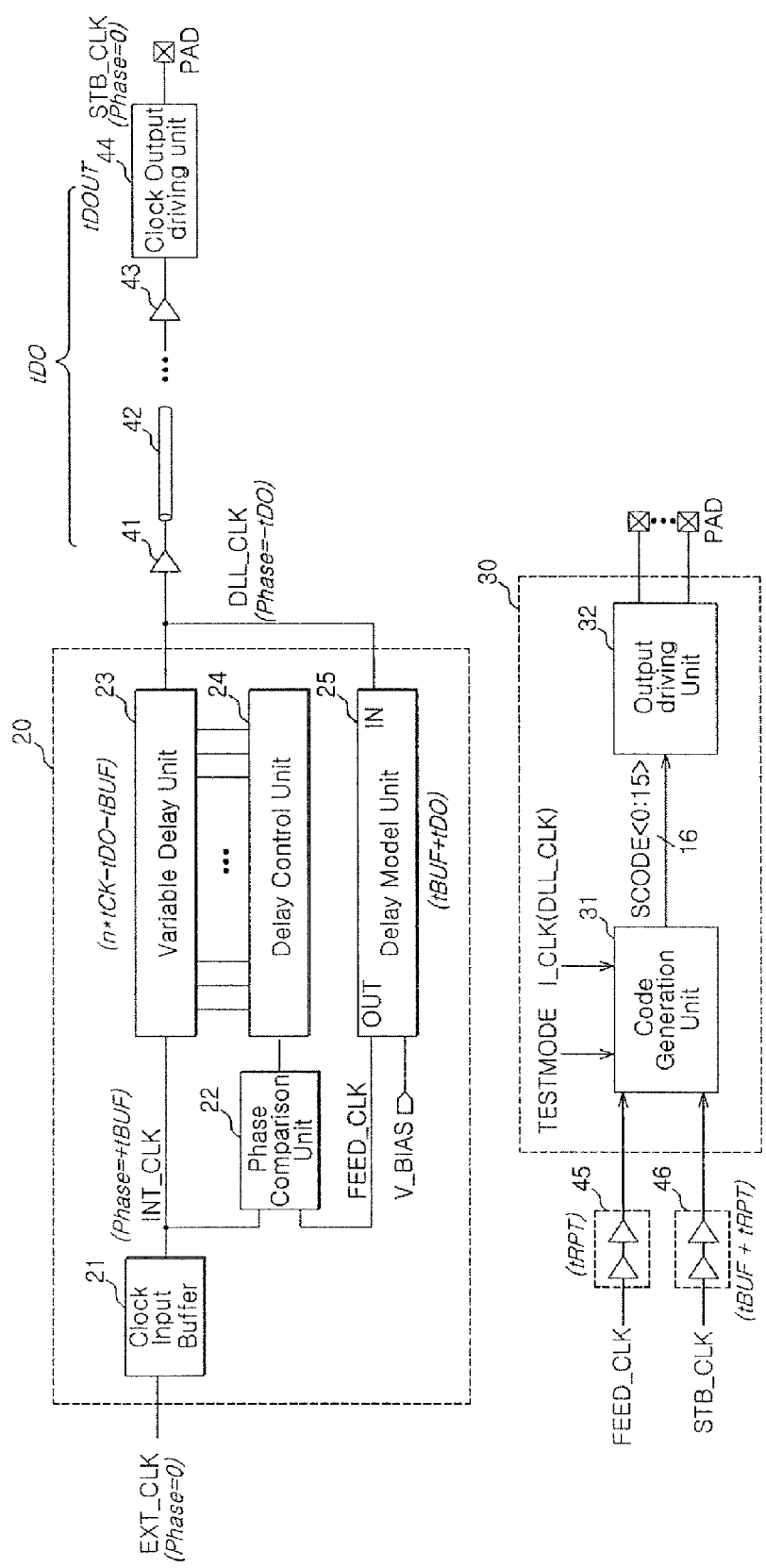
FIG. 2 is a configuration diagram of a semiconductor apparatus according to first embodiment.

FIG. 2 is a configuration diagram of a semiconductor apparatus according to first embodiment.

The semiconductor apparatus according to this embodiment includes only a simple configuration for clearly explaining the technical spirit to be proposed.

Referring to FIG. 2, the semiconductor apparatus includes a DLL 20, a detection code output block 30, an internal clock path is formed from a plurality of repeaters 41 and 43, a transfer line 42, and a clock output driving unit 44.

The detailed configuration and main operation of the semiconductor apparatus configured in such a manner will be described as follows.

The DLL 20 includes a delay model unit 25 in which a delay value of the internal clock path is modeled, and is configured to output a DLL clock signal DLL_CLK in which the phase is controlled by substantially matching that of the delay value of the internal clock path into an applied input clock signal EXT_CLK.

That is, the DLL 20 includes a clock input buffer 21, a variable delay unit 23, a delay model unit 25, a phase comparison unit 22, and a delay control unit 24. The clock input buffer 21 is configured to output an internal clock signal INT_CLK by buffering the input clock signal EXT_CLK. The variable delay unit 23 is configured to delay the internal clock signal INT_CLK outputted from the clock input buffer 21 to output a DLL clock signal DLL_CLK. The delay model unit 25 is configured to output a first phase correction clock signal FEED_CLK obtained by delaying the DLL clock signal DLL_CLK by a model delay value. The phase comparison unit 22 is configured to compare the phases of the internal clock signal INT_CLK and the first phase correction clock signal FEED_CLK. The delay control unit 24 is configured to control the delay value of the variable delay unit 23 as a function of the comparison result of the phase comparison unit 22. For reference, the DLL 20 performs a locking operation when is the phase of the internal clock signal INT_CLK is identical to that of the first phase correction clock signal FEED_CLK. The delay value of the variable delay unit 23 is fixed when the locking operation is performed. The delay control unit 4 may be implemented as a shift register.

When it is assumed that the internal clock path has a delay value of 'tBUF+tDO', the delay model unit 25 is designed in such a manner as to ideally have a delay value of 'tBUF+tDO'. The DLL 20 advances the phase of the input clock signal EXT_CLK by a delay value of '-tDO-tBUF' to generate a DLL clock signal DLL_CLK. Therefore, a second phase correction clock signal STB_CLK which is finally outputted through the internal clock path has substantially the same phase as that of the input clock signal EXT_CLK.

Meanwhile, a difference may still occur between the model delay value of the delay model unit 25 and an actual delay value of the internal clock path, because of a difference between positions at which circuits are disposed and changes in process and voltage which are different from the ideal case.

The detection code output block 30 outputs a phase difference detection code SCODE<0:15> having a code value corresponding to a phase difference between the first phase correction clock signal FEED_CLK generated by substantially matching the model delay value of the delay model unit 25 into the DLL clock signal DLL_CLK and the second phase correction clock signal STB_CLK generated by substantially matching the actual delay value is of the internal clock path into the DLL clock signal DLL_CLK.

The detection code output block 30 includes a code generation unit 31 and an output driving unit 32. The code generation unit 31 is configured to compare the phases of the first and second phase correction clock signals FEED_CLK and STB_CLK in a test mode and configured to subsequently generate a phase difference detection code SCODE<0:15> corresponding to the comparison result. The output driving unit 32 is configured to output the phase difference detection code SCODE<0:15> to the outside through a pad PAD. Therefore, the phase difference detection code SCODE<0:15> outputted through the pad PAD may be analyzed by test equipment to check a difference between the model delay value and the actual delay value.

Figure 3:
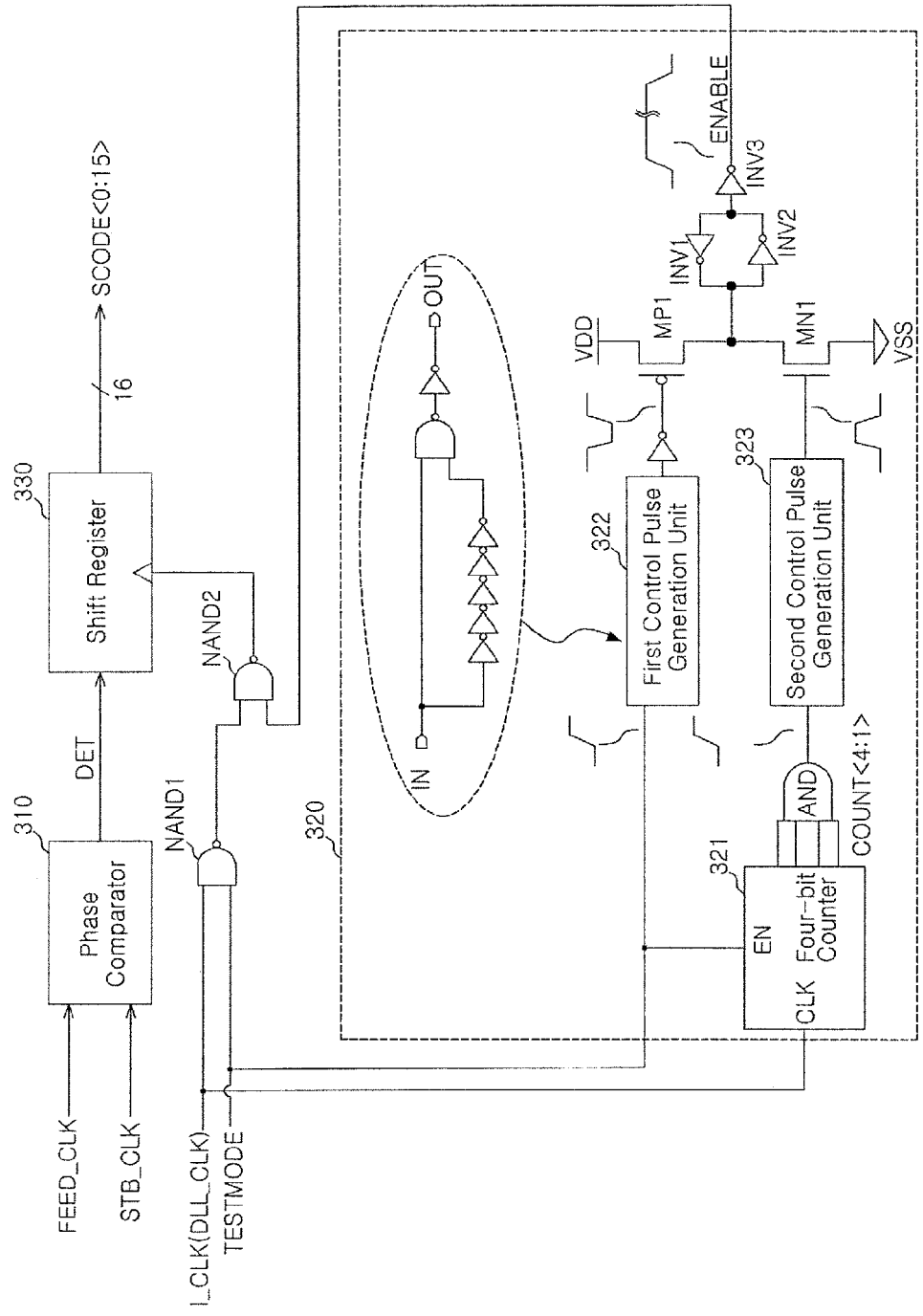
FIG. 3 is a detailed configuration diagram of a code generation unit.

FIG. 3 is a detailed configuration diagram of the code generation unit.

Referring to FIG. 3, the code generation unit 31 includes a phase comparator 310, an enable signal generator 320, and a shift register 330. The phase comparator 310 is configured to compare the phases of the first and second phase correction clock signals FEED_CLK and STB_CLK to output a phase detection signal DET. The enable signal generator 320 is configured to generate an enable signal ENABLE which is activated for a predetermined time, in response to a test signal TESTMODE. The shift register 330 is configured to shift an internal code value in response to the phase detection signal DET during the activation interval of the enable is signal ENABLE.

The enable signal generator 320 includes a four-bit counter 321, a first control pulse generation unit 322, a second control pulse generation unit 323, pull-up and pull-down driving units MP1 and MN1, a latch unit INV1 and INV2 and an inverter INV3. The enable signal ENABLE is a signal which is activated while the four-bit counter 321 is counted for one period, that is, counted 16 times in response to an internal clock signal I_CLK. Therefore, the shift register 330 operates by receiving a clock signal corresponding to the internal clock signal I_CLK during the activation interval of the enable signal ENABLE.

The phase comparator 310 may be configured in various manners. For example, the phase comparator 310 may be designed to output a high-level phase detection signal DET when the phase of the first phase correction clock signal FEED_CLK leads that of the second phase correction clock signal STB_CLK and alternately configured to output a low-level phase detection signal DET in the opposite case. Furthermore, the phase comparator 310 may be designed to compare the phases of the first and second phase correction clock signals FEED_CLK and STB_CLK and output a phase detection signal DET having a pulse width corresponding to the phase difference therebetween. Furthermore, the phase comparator 310 may be designed in such a manner as to compare the phases of the first and second phase correction clock signals FEED_CLK and STB_CLK and output a phase detection signal DET having a voltage level corresponding to the phase difference therebetween.

The shift register 330 right-shifts or left-shifts an internal code value in response to the phase detection signal DET and outputs a phase difference detection code. SCODE<0:15> corresponding to the internal code value.

Figure 4:
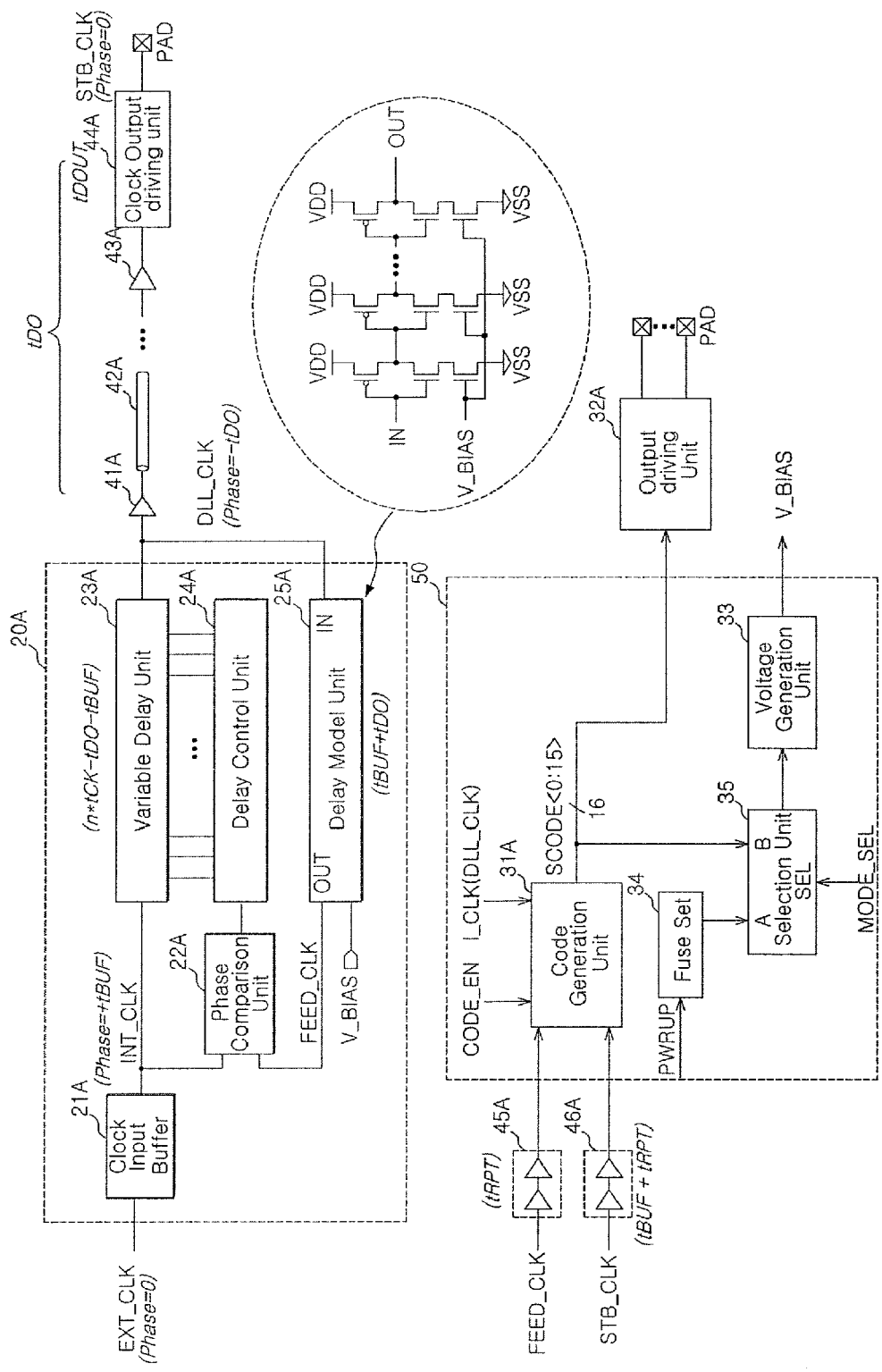
FIG. 4 is a configuration diagram of a semiconductor apparatus according to a second embodiment.

FIG. 4 is a configuration diagram of a semiconductor apparatus according to a second embodiment.

Referring to FIG. 4, the semiconductor apparatus includes a DLL 20A, a control voltage output block 50, in which a plurality of repeaters 41 and 43, a transfer line 42A, and a clock output driving unit 44A form an internal clock path.

The detailed configuration and main operation of the semiconductor apparatus configured in such a manner will be described as follows.

The DLL 20A includes a delay model unit 25A in which a model delay value is controlled as a function of the voltage level of a bias control voltage V_BIAS, and is configured to output a DLL clock signal CLL_CLK in which the phase is controlled by substantially matching a delay value of the internal clock path into an applied input clock signal EXT_CLK. For reference, the delay model unit 25A has a modeled delay value of the internal clock path.

That is, the DLL 20A includes a clock input buffer 21A, a variable delay unit 23A, a delay model unit 25A, a phase comparison unit 22A, and a delay control unit 24A. The clock input buffer 21A is configured to buffer an input clock signal EXT_CLK. The variable delay unit 23A is configured to delay an internal clock signal INT_CLK outputted from the input clock buffer 21A to output a DLL clock signal DLL_CLK. The delay model unit 25A is configured to output a first phase correction clock signal FEED_CLK obtained by delaying the DLL clock signal DLL_CLK by a model delay value. The phase comparison unit 22A is configured to compare the phases of the internal clock signal INT_CLK and the first phase correction clock signal FEED_CLK. The delay control unit 24A is configured to control a delay value of the variable delay unit 23A as a function of the comparison result of the phase comparison unit 22A.

When it is assumed that the internal clock path has a delay value of 'tBUF+tDO', the delay model unit 25A is designed to have a delay value of 'tBUF+tDO' in the ideal situation. The DLL 20A advances the phase of the input clock signal EXT_CLK by a delay value of '-tDO-tBUF' to generate the DLL clock signal DLL_CLK. Therefore, a second phase correction clock signal STB_CLK which is finally outputted through the internal clock path has the same phase as that of the input clock signal EXT_CLK.

Meanwhile, a difference may occur between the model delay value of the delay model unit 25A and an actual delay value of the internal clock path, because of a difference between positions at which circuits are disposed and changes in process and voltage, different from an ideal case.

The control voltage output block 50 is configured to output a bias control voltage V_BIAS having a voltage level corresponding to a is phase difference between the first phase correction clock signal FEED_CLK generated by substantially matching the model delay value of the delay model unit 25A into the DLL clock signal DLL_CLK and the second phase correction clock signal STB_CLK generated by substantially matching the actual delay value of the internal clock path into the DLL clock signal DLL_CLK.

The control voltage output block 50 includes a code generation unit 31A and a voltage generation unit 33. The code generation unit 31A is configured to compare the phases of the first and second phase correction clock signals FEED_CLK and STB_CLK and subsequently to generate a phase difference detection code SCODE<0:15> having a code value corresponding to the comparison result. The voltage generation unit 33 is configured to generate a bias control voltage V_BIAS having a voltage level corresponding to the phase difference detection cod SCODE<0:15>. The code generation unit 31A may be configured in the same manner as the code generation unit 31 of FIG. 3. However, the code generation unit 31 of FIG. 3 is operated through control of the test signal TESTMODE, and the code generation unit 31A is operated through control of a code enable signal CODE_EN.

When the phase of the first phase correction clock signal FEED_CLK leads the phase of the second phase correction clock signal STB_CLK, the voltage level of the bias control voltage V_BIAS decreases in correspondence to the phase difference. Since the voltage level of the bias control voltage V_BIAS decreases, the model is delay value of the delay model unit 25A increases. Therefore, the model delay value is controlled to substantially match the same value as that of the actual delay value.

The control voltage output block 50 according to this embodiment may further include a code storage unit 34 and a selection unit 35. The code storage unit 34 is configured to store the phase difference detection code SCODE<0:15>. The selection unit is configured to transfer a code outputted from the code generation unit 31A to the voltage generation unit 33 in a test mode and to transfer a code stored in the code storage unit 34 to the voltage generation unit 33 in a normal mode. For reference, the code storage unit 34 is implemented as a fuse set.

Since the output driving unit 32A outputs the phase difference detection code SCODE<0:15> to the outside through a pad PAD, the phase difference detection code SCODE<0:15> may be analyzed by a test equipment to check a difference between the model delay value and the actual delay value. Therefore, after an optimal phase difference detection code SCODE<0:15> is checked, the corresponding phase difference detection SCODE<0:15> is programmed into the code storage unit 34. Then, after a power-up operation, the model delay value of the delay model unit 25A is substantially corrected through the bias control voltage V_BIAS generated by the phase difference detection code SCODE<0:15> stored in the code storage unit 34. At this time, a first operation mode and a second operation mode are determined by a mode selection signal MODE_SEL. In the first operation mode, the bias control voltage V_BIAS is generated by the phase difference detection code SCODE<0:15> outputted from the code generation unit 31A in real time. In the second operation mode, the bias control voltage V_BIAS is generated by the phase difference detection code SCODE<0:15> stored in the code storage unit 34. However, without the code storage unit 34 and the selection 35, the bias control voltage V_BIAS corresponding to the phase difference detection code SCODE<0:15> may be generated in real time.

For reference, the semiconductor apparatus may further include a code encoder and a code decoder, in order to reduce the number of transfer lines for transferring the phase difference detection code SCODE<0:15>.

Figure 5:
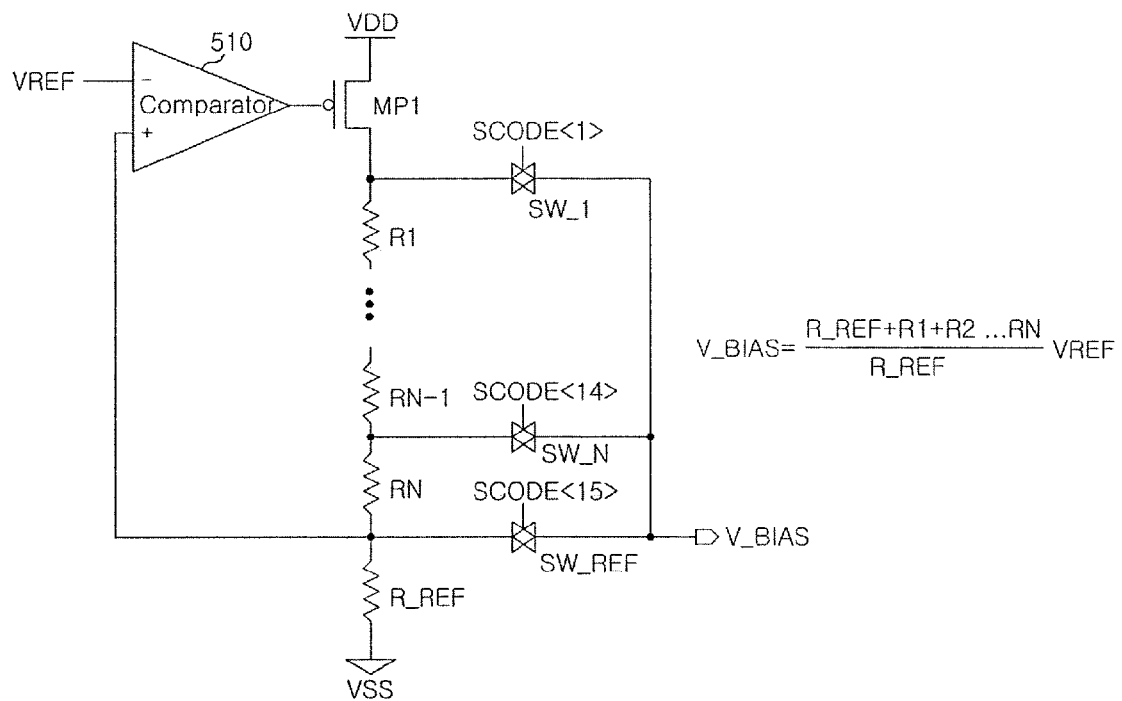
FIG. 5 is a detailed configuration diagram of a voltage generation unit.

FIG. 5 is a detailed configuration diagram of one embodiment of the voltage generation unit.

Referring to FIG. 5, the voltage generation unit 33 includes a plurality of voltage drop elements R1, . . . , RN−1, RN, R_REF, a plurality of switches SW_1 through SW_REF, a comparator 510, and a PMOS transistor MP1. The plurality of voltage drop elements R1 through R_REF are connected between a power supply voltage terminal VDD and a ground voltage terminal VSS. The plurality of switches SW_1 through SW_REF are configured to selectively output voltages divided by the respective voltage drop elements in response to the phase difference detection code SCODE<0:15>. The comparator 510 is configured to compare the voltage divided by the reference voltage drop element R_REF among the plurality of voltage drop elements R1 through R_REF with a reference voltage VREF and output a control voltage corresponding to the comparison result. The PMOS transistor MP1 is configured to supply a driving voltage to the plurality of voltage drop elements R1 through R_REF in response to the outputted control voltage.

Figure 6:
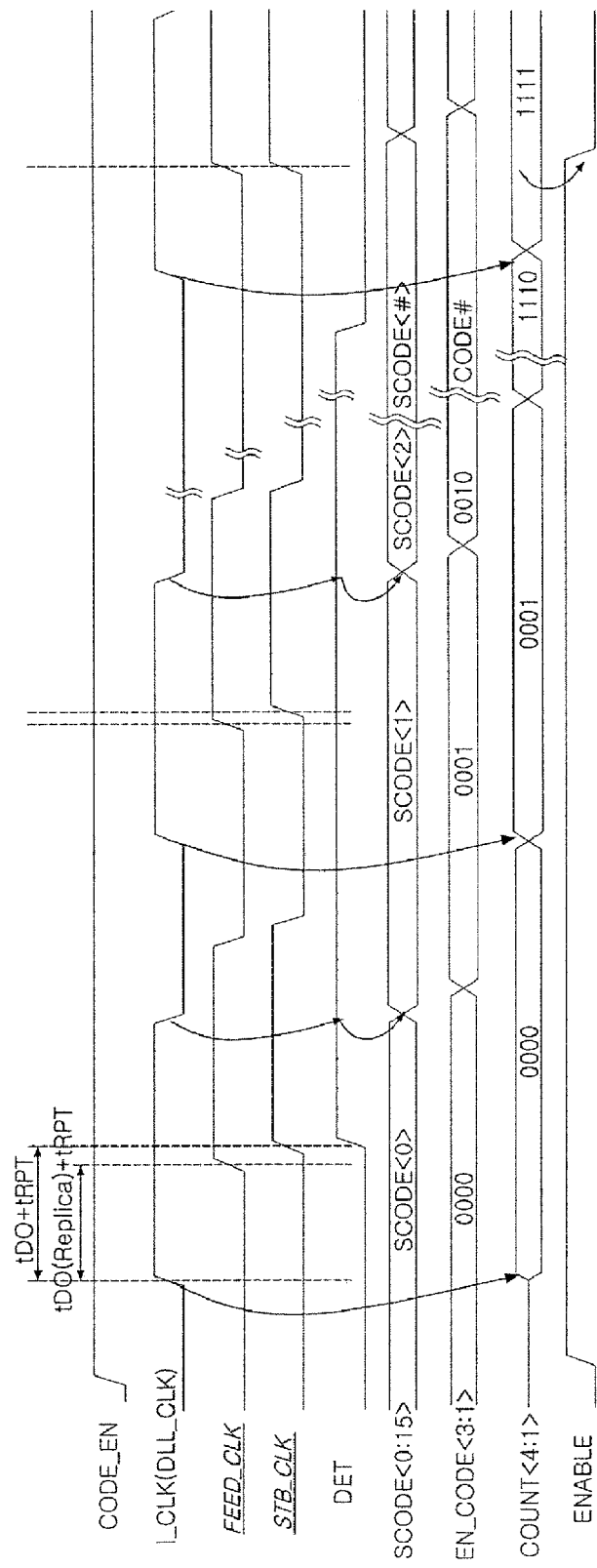
FIG. 6 is a timing diagram showing the internal operation of the semiconductor apparatus according to the second embodiment.

FIG. 6 is a timing diagram showing the internal operation of the semiconductor apparatus according to the second embodiment.

Referring to the timing diagram of FIG. 6 and FIGS. 4 and 5, the operation of the semiconductor apparatus according to the second embodiment will be described as follows.

The code enable signal CODE_EN is a signal which is activated to a high level while the operation is performed.

In this embodiment, the DLL clock signal DLL_CLK is used as an internal clock signal I_CLK for controlling the code generation unit.

Since the phase of the first phase correction clock signal FEED_CLK leads the phase of the second phase correction clock signal STB_CLK in the timing diagram, the phase detection signal DET transits to a high level.

While the enable signal ENABLE is activated to a high level, the shift register of the code generation unit right-shifts an internal code value to output the phase difference detection code SCODE<0:15>.

The voltage level of the bias control voltage V_BIAS is decreased by the phase difference detection code SCODE<0:15> such that the mode delay value increases. Therefore, the phase of the first phase correction clock signal FEED_CLK is finally corrected to substantially match that of the second phase correction clock signal STB_CLK.

For reference, an encoding code EN_CODE<3:1> is a code generated by encoding the phase difference detection code SCODE<0:15>.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a DLL comprising a delay model unit that models a delay value of an internal clock path based on a bias control voltage and the DLL is configured to output a DLL clock signal in which a phase of the DLL clock signal is substantially controlled by the modeled delay value into an applied input clock signal; and
   a control voltage output block configured to output the bias control voltage such that the bias control voltage has a voltage level that corresponds to a phase difference between a first phase correction clock signal generated from the DLL clock signal phase shifted with the modeled delay value and a second phase correction clock signal generated from the DLL clock signal phase shifted with an actual delay value of the internal clock path.

2. The semiconductor apparatus according to claim 1, wherein the control voltage output block comprises:
   a code generation unit configured to compare phases of the first and second phase correction clock signals and configured to generate a phase difference detection code corresponding to the comparison result of the phases of the first and second phase correction clock signals; and
   a voltage generation unit configured to generate the bias control voltage having a voltage level that substantially corresponds to the phase difference detection code.

3. The semiconductor apparatus according to claim 2, wherein the control voltage output block further comprises:
   a code storage unit configured to store the phase difference detection code; and
   a selection unit configured to transfer the phase difference detection code outputted from the code generation unit to the voltage generation unit in a first operation mode and configured to transfer the phase difference detection code stored in the code storage unit to the voltage generation unit in a second operation mode.

4. The semiconductor apparatus according to claim 2, wherein the code generation unit comprises:
   a phase comparator configured to compare phases of the first and second phase correction clock signals and configured to output a phase detection signal having a pulse width that substantially corresponds to the a difference in the compared phases of the first and second phase correction clock signals;
   an enable signal generator configured to generate an enable signal which is activated for a predetermined time; and
   a shift register configured to shift a value of the phase difference detection code in response to the phase detection signal when the enable signal is activated.

5. The semiconductor apparatus according to claim 2, wherein the code generation unit comprises:
   a phase comparator configured to compare phases of the first and second phase correction clock signals and configured to output a phase detection signal having a voltage level that substantially corresponds to a difference in the compared phases of the first and second phase correction clock signals;
   an enable signal generator configured to generate an enable signal which is activated for a predetermined time; and
   a shift register configured to shift a value of the phase difference detection code in response to a voltage level of the phase detection signal when the enable signal is activated.

6. The semiconductor apparatus according to claim 5, wherein the enable signal generator comprises a plural-bit counter controlled by a code enable signal, and is configured to activate the enable signal when the plural-bit counter is counted for one period.

7. The semiconductor apparatus according to claim 1, wherein the second phase correction clock signal is a signal delayed and generated in accordance to a plurality of elements provided in the internal clock path.

8. The semiconductor apparatus according to claim 7, wherein the plurality of elements comprises a repeater, a transfer line, and a clock output driving unit.

* * * * *